United States Patent
Srivastava et al.

(10) Patent No.: US 11,946,686 B2
(45) Date of Patent: Apr. 2, 2024

(54) THERMALLY STABLE FLOW METERS FOR PRECISION FLUID DELIVERY

(71) Applicant: Applied Materials, Inc., Santa Clara, CA (US)

(72) Inventors: Shailendra Srivastava, Fremont, CA (US); Syed Alam, Sunnyvale, CA (US); Nikhil Sudhindrarao Jorapur, Sunnyvale, CA (US); Daemian Raj Benjamin Raj, Fremont, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 596 days.

(21) Appl. No.: 16/979,331

(22) PCT Filed: Mar. 14, 2019

(86) PCT No.: PCT/US2019/022279
§ 371 (c)(1),
(2) Date: Sep. 9, 2020

(87) PCT Pub. No.: WO2019/182866
PCT Pub. Date: Sep. 26, 2019

(65) Prior Publication Data
US 2021/0003340 A1   Jan. 7, 2021

Related U.S. Application Data

(60) Provisional application No. 62/646,681, filed on Mar. 22, 2018.

(51) Int. Cl.
*F25D 17/06*  (2006.01)
*F25B 21/02*  (2006.01)
(Continued)

(52) U.S. Cl.
CPC .............. *F25D 17/06* (2013.01); *F25B 21/02* (2013.01); *H10N 10/13* (2023.02); *F25B 2321/0251* (2013.01); *H01L 21/67017* (2013.01)

(58) Field of Classification Search
CPC ......... C23C 16/45561; H01L 21/67109; H01L 21/67253; H01L 21/67098; H01L 21/6715; H01L 21/67276
See application file for complete search history.

(56) References Cited

U.S. PATENT DOCUMENTS 6,023,969 A * 2/2000 Feller ................. G01F 5/00
                                                    73/204.25
6,412,287 B1 * 7/2002 Hughes .................. B60N 2/793
                                                    62/3.61

(Continued)

OTHER PUBLICATIONS

International Search Report and Written Opinion issued to PCT/U2019/022279 dated Jun. 27, 2019.

*Primary Examiner* — Ana M Vazquez
(74) *Attorney, Agent, or Firm* — Patterson + Sheridan, LLP; B. Todd Patterson

(57) ABSTRACT

A fluid delivery device is disclosed. The fluid delivery device includes a fluid flow meter. The fluid flow meter is enclosed in an insulated box. An intake is provided on the insulated box for providing a forced cooling gas flow over the fluid flow meter. An exhaust is provided on the insulated box from which the forced cooling gas exits the insulated box.

21 Claims, 5 Drawing Sheets

(51) Int. Cl.
   *H01L 21/67*   (2006.01)
   *H10N 10/13*   (2023.01)

(56) References Cited

U.S. PATENT DOCUMENTS

| | | | |
|---|---|---|---|
| RE41,295 E * | 5/2010 | Cauchy | 62/3.3 |
| 9,581,066 B2 * | 2/2017 | Larsson | F16L 53/38 |
| 2001/0044161 A1 | 11/2001 | Komiyama | |
| 2007/0281083 A1 | 12/2007 | Lakshmanan et al. | |
| 2008/0149031 A1 | 6/2008 | Chu et al. | |
| 2011/0265951 A1 | 11/2011 | Xu et al. | |
| 2011/0306287 A1 * | 12/2011 | Takagi | H05K 7/20745 454/184 |
| 2012/0103425 A1 | 5/2012 | Yudovsky et al. | |

* cited by examiner

THERMALLY STABLE FLOW METERS FOR PRECISION FLUID DELIVERY

BACKGROUND

Field

The present disclosure relates generally to flow meters and, more particularly, thermally stable flow meters for precision fluid delivery.

Description of the Related Art

Semiconductor device manufacturing and the like involves various processes that, in general, entail delivery of fluids to a processing chamber, such as an etch chamber or a deposition chamber, in precisely controlled amounts and/or flow rates. Fluid amounts supplied in such processes are generally carefully controlled to provide the intended processing results, such as specific film compositions, film thicknesses, etching results, or the like. For example, in some processes, a silicon dioxide film is deposited on a substrate in a deposition chamber via a process that utilizes a liquid tetraethyl orthosilicate (TEOS) solution as precursor. In such a process, the liquid solution flows through a liquid flow meter (LFM), followed by a vaporizer before being supplied to the deposition chamber. In the deposition chamber, the precursor is decomposed in the presence of a radio frequency (RF) plasma or the like and is ultimately deposited on the substrate as a silicon dioxide film. In such a deposition scheme, any variations in the amount and/or feed rate of the precursor fed into the deposition chamber may result in variations in the film deposition rate, and ultimately, the final deposited film thickness, film properties, and/or film composition.

Accordingly, what is need in the art are improved liquid flow meters for precise fluid delivery.

SUMMARY

In an embodiment, a fluid delivery apparatus comprises a fluid flow meter, an insulated box enclosing the fluid flow meter. An intake and an exhaust are provided on the insulated box. The intake provides a forced cooling gas flow over the fluid flow meter, and the forced cooling gas exits the insulated box from the exhaust.

In another embodiment, a modular fluid delivery apparatus for incorporation in a precision gas panel comprises: a first fluid flow meter for providing a first process fluid, and a second fluid flow meter for providing a second process fluid. A cold side plate is thermally coupled on a first side to the first and second flow meters. A thermoelectric device is thermally coupled to the cold-side plate on a second side opposite the first side. A hot side plate is thermally coupled to the thermoelectric device. The thermoelectric device is between the cold side plate and the hot side plate. A heat exchange system is coupled to the hot side plate and configured to exhaust heat from the modular fluid delivery apparatus. An insulated box encloses the first and second fluid flow meters. The disclosure is not limited to modules with two fluid flow meters and modules have a different number of fluid flow meters, for example, three to six or more fluid flow meters could be utilized. Likewise, in other embodiments, a module may include only a single fluid flow meter.

In yet another embodiment, a fluid delivery apparatus comprises a plurality of fluid flow meters and a first box enclosing the plurality of fluid flow meters. An intake is provided on the first box through which a cooling gas enters the first box. An exhaust is provided on the first box through which heated cooling gas ("hot gas") exits the first box. The exhaust on the first box may comprise an exhausting mechanism to draw cooling gas from the first box. A second box encloses the first box and provides a circulation path via which the cooling gas from the exhaust returns to the intake. A cold side plate is thermally coupled to at least one side of the second box. A thermoelectric device is thermally coupled to the cold side plate. A hot side plate is thermally coupled to the thermoelectric device. The thermoelectric device is between the cold side plate and the hot side plate. A heat exchange system is thermally coupled to the hot side plate and configured to exhaust heat withdrawn from the plurality of fluid flow meters.

BRIEF DESCRIPTION OF THE DRAWINGS

It is to be understood that both the foregoing general description and the following detailed description are merely exemplary, and are intended to provide an overview or framework for understanding the nature and character of the claims. The accompanying drawings are included to provide a further understanding, and are incorporated in, and constitute a part of, this specification. The drawings illustrate example embodiment(s), and together with the description, serve to explain principles and operation of the various embodiments of the present disclosure.

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only example embodiments and are therefore not to be considered limiting the scope of the present disclosure, which may admit to other equally effective embodiments.

Figure 1:
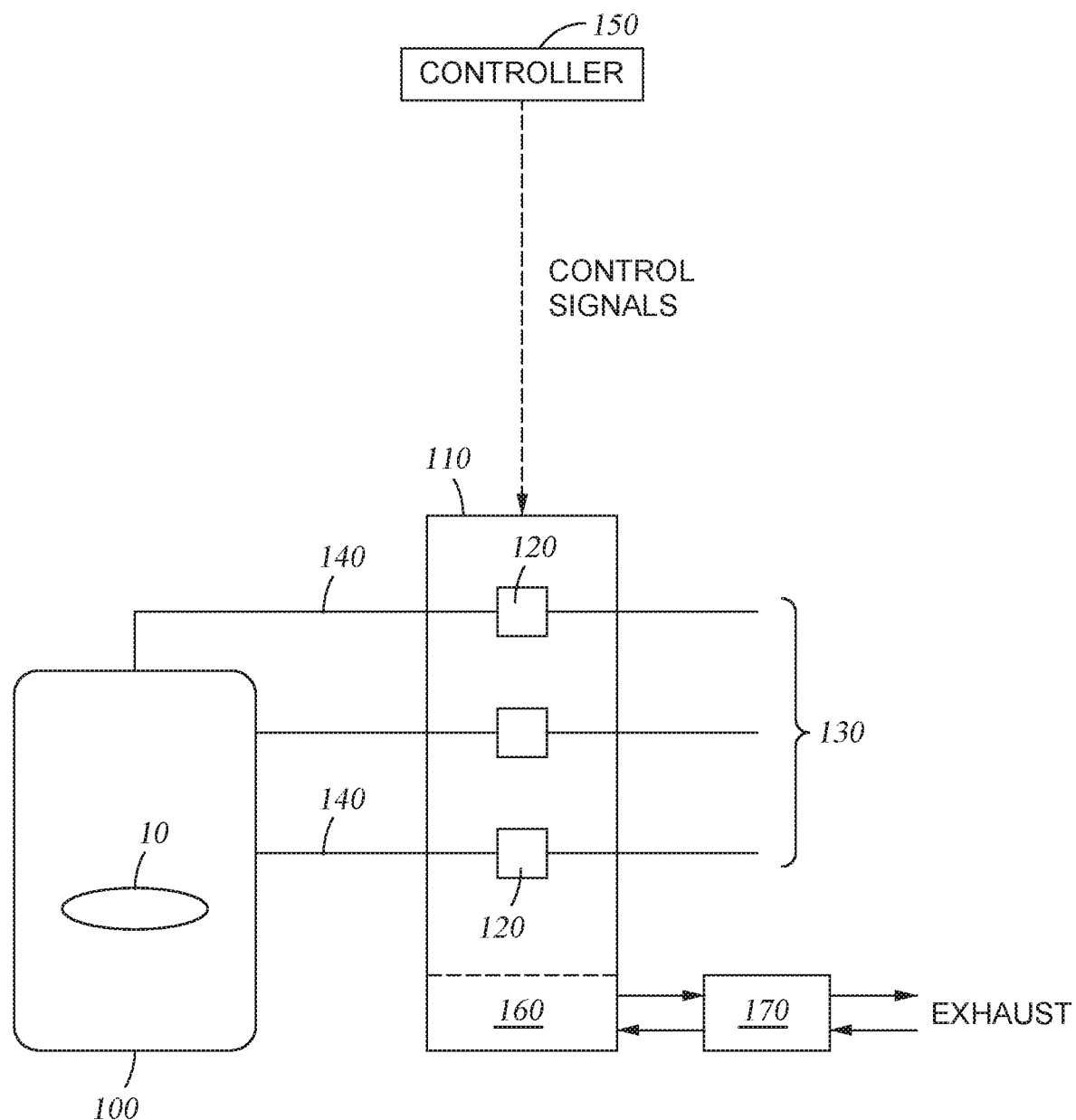

To facilitate understanding, identical reference numerals have been used, where possible, to designate substantially identical elements that are common to the different figures. It is contemplated that elements and features disclosed for any one embodiment may be beneficially incorporated in other embodiments without specific recitation.

Additional features and advantages will be set forth in the detailed description which follows, and in part will be readily apparent to those skilled in the art from that description or recognized by practicing the embodiments as described herein, including the detailed description which follows, the claims, as well as the appended drawings.

FIG. 1 schematically depicts a process chamber coupled to a gas panel used to provide process fluids to the process chamber, according to one embodiment of the present disclosure.

Figure 2:
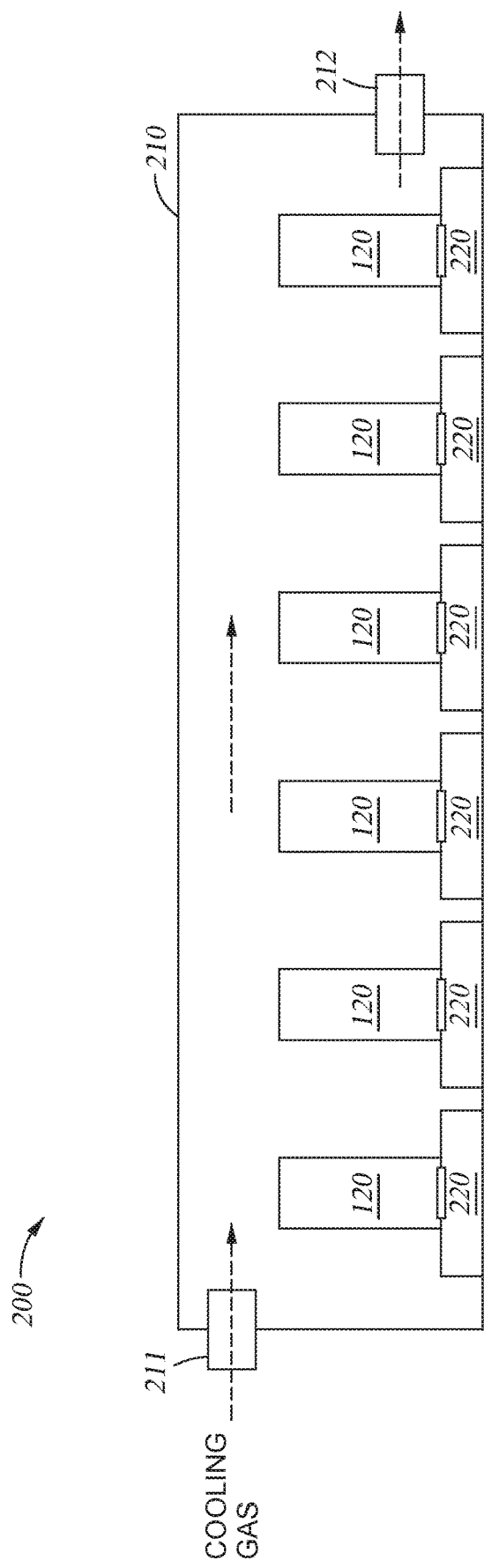

FIG. 2 depicts a cross-section of a fluid delivery apparatus according to one embodiment of the present disclosure.

Figure 3:
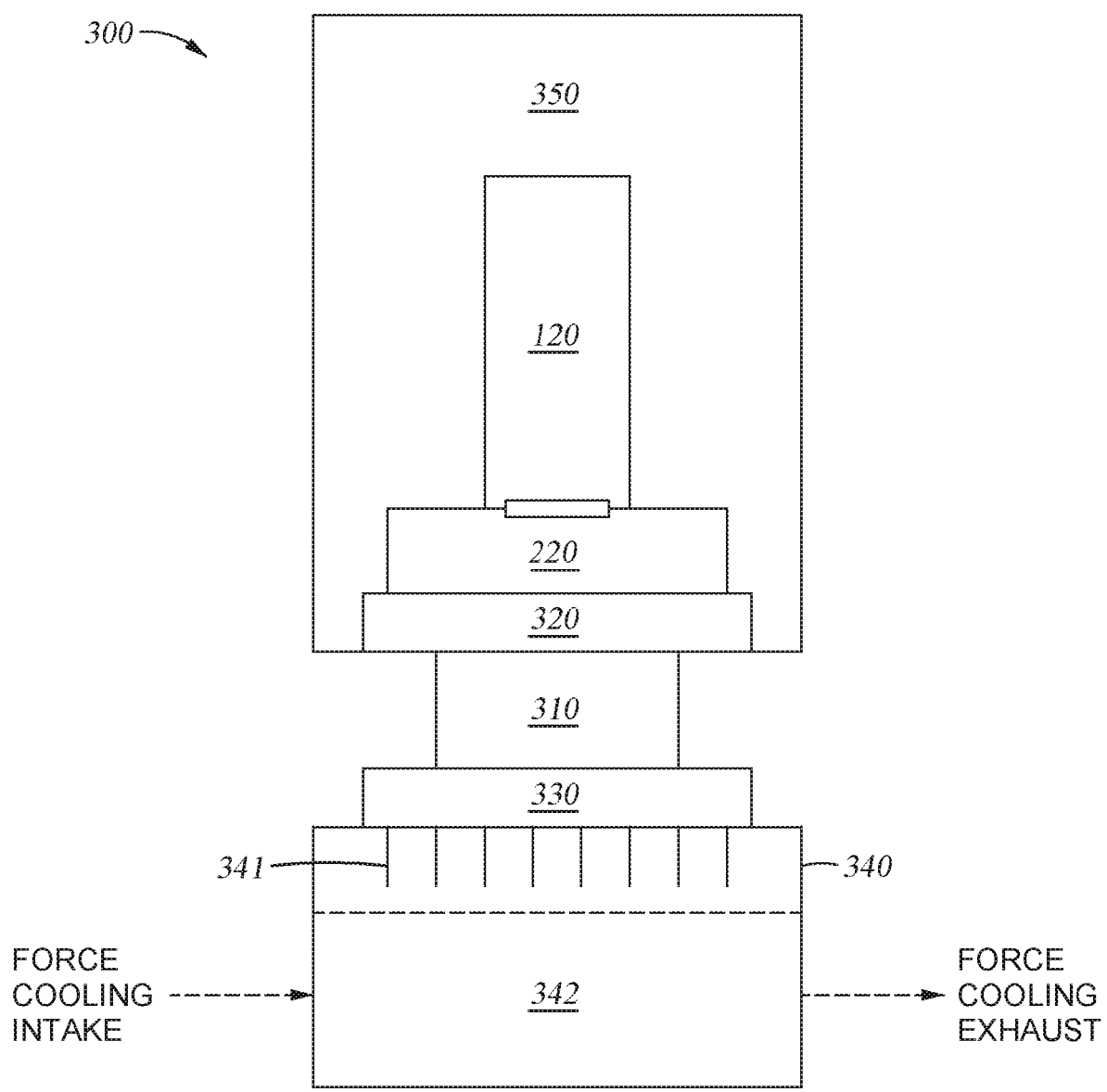

FIG. 3 depicts a cross-section of a fluid delivery apparatus according to one embodiment of the present disclosure.

Figure 4:
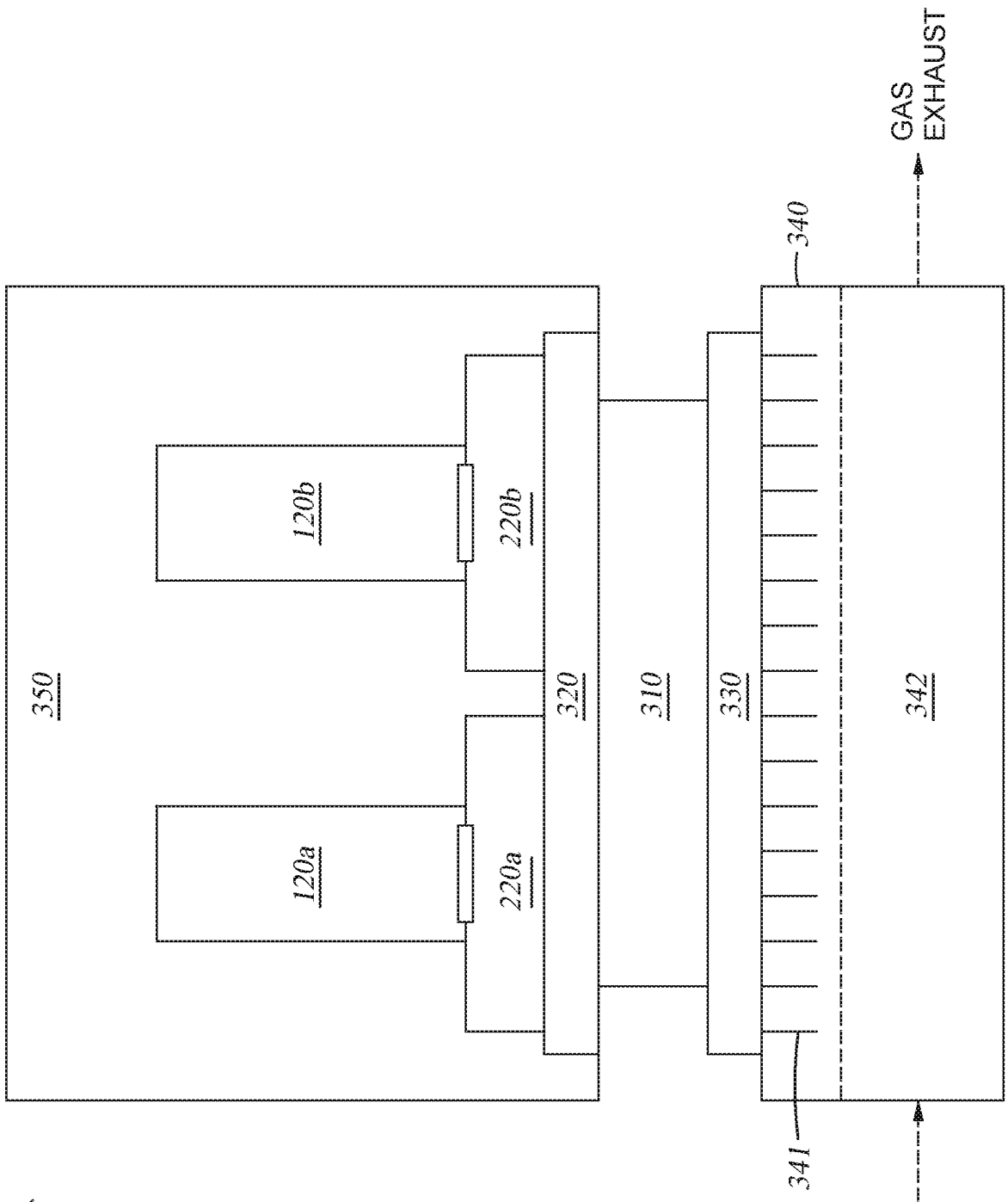

FIG. 4 depicts a cross-section of a fluid delivery apparatus according to one embodiment of the present disclosure.

Figure 5:
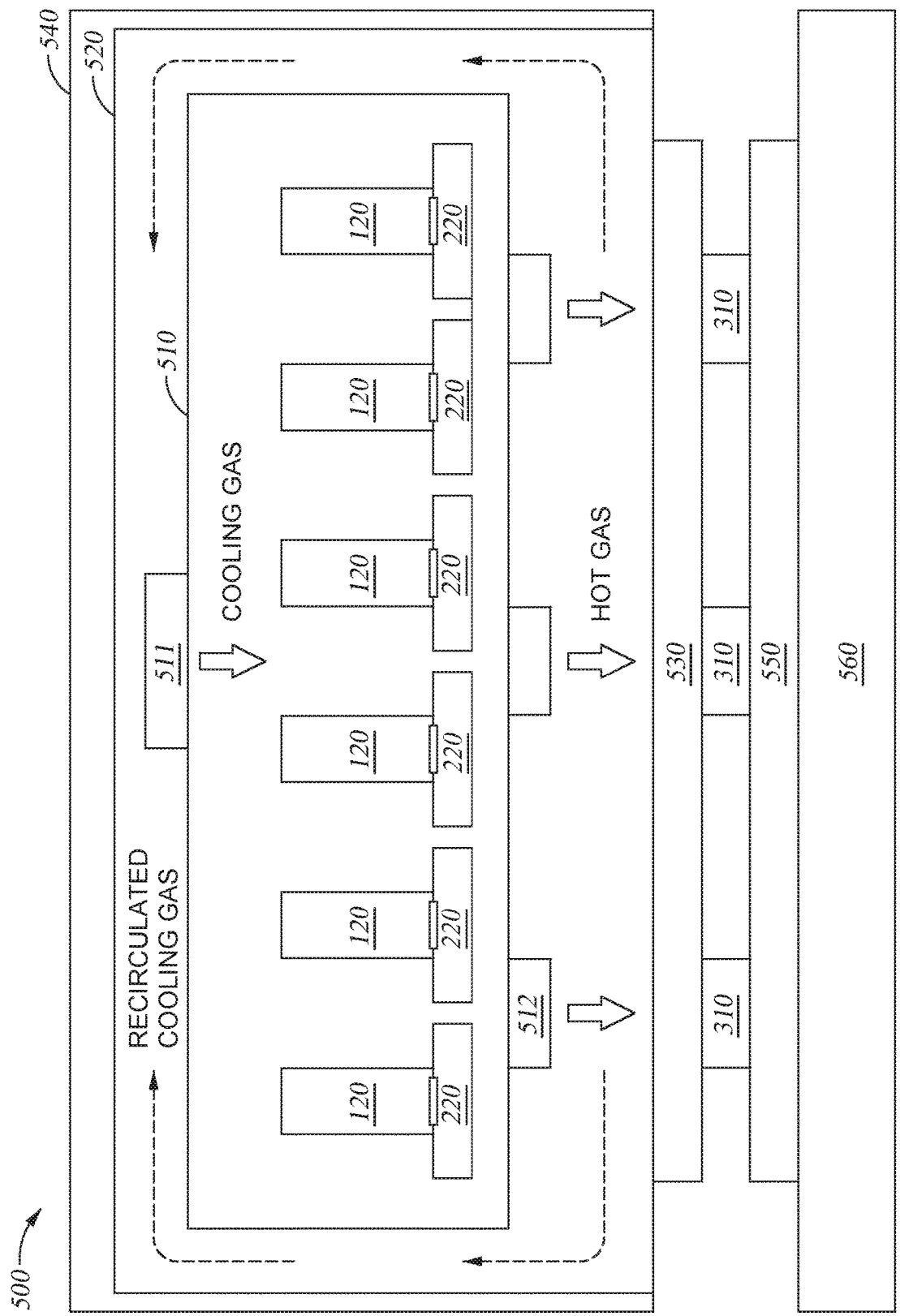

FIG. 5 depicts a cross-section of a fluid delivery apparatus according to one embodiment of the present disclosure.

DETAILED DESCRIPTION

The present disclosure relates to a fluid delivery apparatus for deposition chambers. The fluid delivery device includes a fluid flow meter with improved thermal stability for enhanced precision in fluid delivery. The fluid flow meter is enclosed in an insulated box. An intake is provided on the insulated box for providing a forced cooling gas flow over the fluid flow meter. An exhaust is provided on the insulated box from which the forced cooling gas exits the insulated box.

Certain film deposition schemes utilized in semiconductor device manufacturing and other technology areas, such as flat panel display manufacturing, utilize liquid precursor materials that are fed to a vacuum deposition chamber. For example, as described above, a silicon dioxide film deposition process utilizes liquid TEOS as a precursor that flows through a liquid flow meter (LFM) prior to being vaporized and fed to the deposition chamber. In such deposition schemes, it has been found that even small deviations in precursor volumetric flow rates, such as about 1%, will result in substantial film deposition rate variation. It has also been discovered that LFM temperature has an unexpectedly major effect on liquid precursor flow measurement accuracy. For example, a change of about 20° C. in LFM body temperature can result in greater than 12% precursor flow rate error.

In general, temperatures of LFMs are not conventionally controlled by separate means beyond those employed to control ambient temperatures within a manufacturing site. Thus, flow measurements by these LFMs are subject to substantial error when the temperature of the LFM varies for any given reason. Therefore, deposited films resulting from schemes relying on LFMs are subject to substantial variations in deposited film thicknesses and/or compositions due to uncontrolled thermal variations in the LFM or the local environment.

LFMs, which control the supply of a liquid, are a subset of fluid flow meters (FFMs), which control the supply of a fluid. The fluid may be a liquid phase material, a gas phase material, or a mixed phase material. Any description of LFMs is likewise applicable as a description as a FFM.

FIG. 1 schematically depicts a process chamber 100 coupled to a gas panel 110 that is used to provide various process fluids to the process chamber 100, according to one embodiment. The process chamber 100 is for processing substrates 10 or the like, and may be, for example, an atomic layer deposition, chamber, an anneal chamber, a chemical vapor deposition chamber, a physical vapor deposition chamber, an etch chamber, a treatment chamber, or the like. The gas panel 110 incorporates one or more fluid flow meters (FFM) 120. Each FFM 120 controls the supply of a process fluid (a liquid or a gas) to the process chamber according to control signals provided by a controller 150. The process fluids are supplied from external storage systems (not shown), such as tanks, reservoirs, or generators, via input supply lines 130. After passing through the FFM 120, the process fluids are supplied to the process chamber 100 via output supply lines 140. Additional mechanisms (not shown), such as heaters, chillers, mixers, manifolds, vaporizers, condensers, filters, or the like, may be disposed between and in connection with the FFM 120 and the process chamber 100. Such additional mechanisms may be external to the output supply lines 140, in-line with the output supply lines 140, or integrated with the output supply lines 140. One or more FFMs 120 may be utilized to supply the same process fluid. It is also contemplated that each FFM 120 may be used to supply a different process fluid.

Typically, the gas panel 110 is connected to or equipped with an exhaust system 160. The exhaust system 160 is intended, amongst other purposes, to help maintain the FFMs 120 at a specific operating temperature, for example, approximately 25° C. However, the performance of the exhaust system 160 may be dependent on a facility-wide exhaust system 170, the performance of which may vary substantially during operations according to exhausting load changes across the facility that generally cannot be controlled, predicted, or easily compensated.

In some instances, the exhaust system 160 may also intake cooling air from a facility-wide system. This cooling air may vary in both temperature and flow rate according to load changes across the facility that also cannot be easily controlled, predicted, or easily compensated. There is also a possibility that process fluids being fed to the FFMs 120 may have temperatures that themselves vary uncontrollably. Such fluctuations in process fluid temperatures may result in temperature changes of the associated FFMs 120. Likewise, a temperature change in one FFM 120 may result in temperature change of adjacent or nearby FFMs.

In general, any temperature change of the FFM 120 may result in a variation in the amount of fluid supplied by the FFM 120 because the FFMs 120 are typically calibrated for a particular operating temperature range (e.g., about 25° C.). As such, it would be desirable to provide systems having more stable operating temperatures so as to provide more precise process fluid delivery via the FFMs 120.

FIG. 2 depicts a fluid delivery apparatus 200 according to the present disclosure. In general, the fluid delivery apparatus 200 is coupled to or integrated with the gas delivery panel 160 depicted in FIG. 1. The fluid delivery apparatus 200 provides an operating environment for the FFMs 120 that is thermally stable. The thermally stable operating environment for the FFMs 120 improves the precision of fluid delivery via the FFMs 120. As depicted in FIG. 2, each FFM 120 is coupled or integrated with the fluid delivery apparatus 200 via an optional mounting base 220.

Fluid delivery apparatus 200 includes at least one FFM 120 (three are labeled in FIG. 2) enclosed within an insulated box 210, such as a thermally insulated box. In general, the insulated box 210 may be constructed of any thermally insulating material. For example, the insulated box 210 may be constructed of polytetrafluoroethylene-coated ("PTFE") cloth. The insulated box 210 includes an intake 211 and an exhaust 212. The intake 211 may optionally incorporate a fan, an impeller, or the like to flow a cooling gas (e.g., air at about 25° C.) into the insulated box 210. The exhaust 212 may optionally incorporate a fan, an impeller, or the like to remove gasses from the insulated box 210 to promote acceptable flow of the cooling gas within the insulated box 210.

The positioning of the intake 211 and the exhaust 212 may vary depending on the desired internal flow of the cooling gas within the insulated box 210. In one example, the intake 211 and the exhaust 212 may be disposed on opposing sides of the insulated box 210. In another example, the intake 211 and the exhaust 212 may be positioned on adjacent sides of the insulated box 210, or on the same side of the insulated box 210. Likewise, the flow rate of forced cooling gas may be varied according to thermal loads and operating specifications of the FFMs 120. For example, vibrations, or the like, induced by forced cooling gas flow and/or any mechanisms provided for forcing the cooling gas flow may adversely affect the performance of the FFMs 120.

Additionally, it is possible to provide the intake 211 as a plurality of ports at varying positions on the insulated box 210. For example, two or more intake ports 211 may be disposed on one side of the insulated box 210. In another example, two or more intake ports 211 may be disposed on different sides of the insulated box 210. Likewise, it is possible to provide the exhaust 212 as a plurality of ports at varying positions on the insulated box 210. Further, the number of ports provided for the intake 211 does not have to equal the number of ports for the exhaust 212. For example, in one aspect of the disclosure, the intake 211 may consist of one port and the exhaust 212 may consist of two or more ports.

FIG. 3 depicts a fluid delivery apparatus 300 according to one embodiment. In the fluid delivery apparatus 300, a thermoelectric cooler (TEC) 310, such as a Peltier device, is mounted to the FFM 120 via a cold side plate 320. In one embodiment, the cold side plate 320 couples to the optional mounting base 220 of the FFM 120. The TEC 310 is positioned between the cold side plate 320 and a hot side plate 330. A heat exchange system 340 is thermally coupled to the hot side plate 330. In the example depicted in FIG. 3, the heat exchange system 340 includes a fin-type radiator 341 coupled to air flow manifold 342 providing forced convection cooling over the fin-type radiator 341, but, in general, any heat exchange method or combination of methods may be adopted. For example, a simple radiator plate, a fin-type radiator, a forced convection system (either a gas or a liquid system), and combinations of these methods can be utilized.

In general, the TEC 310 can be a single Peltier device or a plurality of such devices. The sizing of the TEC 310 can be determined based on expected operating currents and thermal loads. Furthermore, since Peltier devices may be operated as either heaters or coolers depending on the voltage supplied thereto, the temperature of the FFM 120 associated with the TEC 310 can be raised or lowered as needed to provide thermal stability. However, in typical operation, the TEC 310 is operated to draw heat from the associated FFM 120 and reject heat to the hot side plate 330.

As depicted in FIG. 3, a single FFM 120 is enclosed within an insulating box 350. In general, the fluid delivery apparatus 300 may be of a modular design, permitting several fluid delivery apparatuses 300 to be incorporated into the gas panel 160.

FIG. 4 depicts a fluid delivery apparatus 400 according to one embodiment. In general, the fluid delivery apparatus 400 is similar to the fluid delivery apparatus 300, except for the sizing of the cold side plate 320 so as to permit mounting of at least two FFMs 120 (FFM 120a and FFM 120b), rather than the single FFM 120 in fluid delivery apparatus 300. As depicted, two FFMs 120 are mounted on a single cold side plate 320 via two optional mounting bases (220a and 220b). Other than corresponding changes in sizing, components in the fluid delivery apparatus 400 are otherwise substantially similar to those in the fluid delivery apparatus 300, as denoted by the use of the same reference numerals for the components.

Furthermore, though depicted in FIG. 4 as a single element, the TEC 310 may be provided as a plurality of separate elements. For example, one TEC 310 cooling element may be disposed directly under the FFM 120a and another TEC 310 cooling element may be disposed directly under the FFM 120b. The different elements comprising the TEC 310 may be collectively or separately controlled according to the desired output characteristics of the fluid delivery apparatus 400.

As depicted in FIG. 4, the two FFMs 120 (120a and 120b) are enclosed within the insulating box 350. In general, the fluid delivery apparatus 400 may be of a modular design, permitting several fluid delivery apparatuses 400 to be incorporated into the gas panel 160. In general, there is no limit to the number of FFMs 120 that may be utilized within the insulating box 350, and additional FFMs 120 may be incorporated in the modularized design scheme. For example, three, four, five, six, or more FFMs 120 may be disposed within the insulating box 350. Likewise, one or more TECs 310 may be utilized in various modularized implementations of the fluid delivery apparatus 400. For example, three, four, five, or more TECs 310 may be utilized with the fluid delivery apparatus 400. Furthermore, the cold side plate 320 may be provided as a plurality of separate and modular units. For example, in a six FFM 120 embodiment, each of three pairs of the FFMs 120 may be mounted on a separated unit of the cold side plate 320.

FIG. 5 depicts a fluid delivery apparatus 500 according to one embodiment. In fluid delivery apparatus 500, at least one FFM 120 is disposed within an enclosure box 510. The enclosure box 510 has at least one intake 511 through which a cooling gas (e.g., clean dry air or high purity nitrogen) is supplied. The enclosure box 510 further includes at least one exhaust 512 through which the cooling gas is withdrawn from the enclosure box 510 as heated or hot gas. The intake 511 may be provided as a plurality of openings in, or ports on, the enclosure box 510. The intake 511 may optionally include a fan, impeller, or the like to supply forced cooling air through the opening(s) or port(s). Likewise, the exhaust 512 may be provided as a plurality of openings in, or ports on, the enclosure box 510. The exhaust 512 may optionally include a fan, impeller, or the like to force heated cooling air ("hot gas") from the opening(s) or port(s). Particular placement of the intake(s) 511 and the exhaust(s) 512 on the enclosure box 510 is not limited and the placement and arrangement of these aspects as depicted in FIG. 5 is merely an example. Likewise, in some examples, either or both the intake 511 or the exhaust 512 may optionally incorporate a gas forcing mechanism, such as a fan or an impeller, to promote circulation of the cooling gas within the fluid delivery apparatus 500.

An outer box 520 surrounds the enclosure box 510. The outer box 520 forms a substantially sealed zone in which cooling gas is maintained. The outer box 520 provides flow paths for re-circulating the cooling gas exhausted from the enclosure box 510 (via the exhaust 512) back to the intake 511.

The outer box 520 is thermally coupled to a cold side plate 530 on at least one side. A thermal layer 540 is supplied on an outer surface of the outer box 520 in a manner that does not limit the thermal coupling between the outer box 520 and the cold side plate 530. The thermal layer 540 may be a distinct thermally insulating material covering the outer box 520 or may be an integrated portion of the outer box 520. In one embodiment, the thermally insulting material is PTFE. Though the example depicted in FIG. 5 shows a gap or separation between the thermal layer 540 and the outer box 520, the thermal layer 540 may be in direct contact with outer box 520 in whole or in part.

As depicted in FIG. 5, a plurality of TECs 310 are sandwiched between the cold side plate 530 and a hot side plate 550. The hot side plate 550 is thermally coupled to a heat exchange system 560. In general, the heat exchange system 560 may be substantially similar to the heat exchange system 340 described above in connection with the fluid delivery apparatus 300. For example, a simple radiator plate, a fin-type radiator, a forced convection system (either a gas or a liquid system), and combinations of these methods may be utilized with the heat exchange system 560.

In operation, heat from the FFMs 120 is transferred to the cooling gas circulating within the enclosure box 510. The cooling gas picks up heat from the FFMs 120 and is exhausted from enclosure box 510 via the exhaust 512, but still maintained within the outer box 520. The exhausted cooling gas (now heated by the FFMs 120) is then moved into thermal contact with the cold side plate 530, which has a temperature controlled by the TECs 310. The exhausted cooling gas (now cooled by cold side plate 530) is then re-supplied via a re-circulation path within the outer box 520 to the intake 511 of the enclosure box 510. The heat transferred from the cooling gas to the cold side plate 530 is ultimately withdrawn to the outside of the liquid delivery apparatus 500 via operation of the heat exchange system 560.

As depicted in the example in FIG. 5, three TECs 310 are provided for six FFMs 120. In other examples, one TEC 310 can be provided for each FFM 120 or one TEC 310 can be provided for the entire fluid delivery apparatus 500. Furthermore, when a plurality of TECs 310 is supplied, each may be separately controlled as necessary to maintain thermal stability of the FFMs 120.

Furthermore, while the specific examples provided above utilize thermoelectric coolers, other cooling systems are also contemplated, such as liquid chiller systems, evaporation coolers, and the like.

In this specification, "thermally coupled" refers to components through which heat can flow one to the other without substantial impediment. The thermally coupled components may be in direct physical contact or there may interposed components, such as thermal pastes or other high thermal conductivity materials between the thermally coupled components.

While the foregoing is directed to particular embodiments of the present disclosure, it is to be understood that these embodiments are merely illustrative of principles and applications. It is therefore to be understood that various modifications may be made to the illustrative embodiments to provide other embodiments without departing from the spirit and scope of the present disclosure, as represented by the appended claims.

What is claimed is:

1. A fluid delivery apparatus, comprising:
   a fluid flow meter having a fluid inlet and a fluid outlet configured to route process fluid through the fluid flow meter;
   an insulated box enclosing the fluid flow meter;
   an intake coupled to the insulated box, the intake configured to provide a forced cooling gas flow around an exterior of the fluid flow meter; and
   an exhaust coupled to the insulated box from which the forced cooling gas exits the insulated box;
   a cold side plate conductively coupled to the fluid flow meter and disposed between a cooler device and the fluid flow meter; and
   a hot side plate conductively coupled to the cooler device and disposed opposite the cold side plate and external of the insulated box.

2. The fluid delivery apparatus of claim 1, wherein the fluid flow meter is configured to supply a process gas to a vacuum deposition chamber.

3. A gas panel coupled to a process chamber, the gas panel comprising:
   at least one fluid delivery apparatus according to claim 1.

4. The fluid delivery apparatus of claim 1, wherein the cooler device is thermally coupled to the exterior of the insulated box.

5. The fluid delivery apparatus of claim 4, further comprising:
   a heat exchange system thermally coupled to the cooler device.

6. The fluid delivery apparatus of claim 5, wherein the heat exchange system comprises a fin-type radiator and a forced convection system forcing a gas over the fin-type radiator.

7. The fluid delivery apparatus of claim 4, wherein the cooler device is a thermoelectric cooler.

8. The fluid delivery apparatus of claim 7, wherein the thermoelectric cooler is a Peltier device.

9. The fluid delivery apparatus of claim 1, wherein the intake comprises a fan.

10. The fluid delivery apparatus of claim 1, wherein the exhaust comprises a fan.

11. The fluid delivery apparatus of claim 1, further comprising:
    the cold side plate thermally coupled to the fluid flow meter, the cold side plate disposed between the cooler device and the fluid flow meter; and
    the hot side plate thermally coupled to the cooler device and disposed opposite the cold side plate and externally of the insulated box.

12. The fluid delivery apparatus of claim 11, wherein the cold side plate is comprised of a plurality of separate and modular units.

13. A modular fluid delivery apparatus for incorporation into a precision gas panel, the modular fluid delivery apparatus comprising:
    a first fluid flow meter for providing a first process fluid, disposed within an insulated box;
    a second fluid flow meter for providing a second process fluid, disposed within the insulated box;
    an intake coupled to the insulated box, the intake providing a forced cooling gas flow around an exterior of the first and second fluid flow meters;
    a cold side plate to which the first and second flow meters are conductively coupled to on a first side;
    a thermoelectric device conductively coupled to the cold-side plate on a second side opposite the first side;
    a hot side plate conductively coupled to the thermoelectric device, the hotside plate disposed opposite the cold side plate and external of the insulated box, and the thermoelectric device disposed between the cold side plate and the hot side plate;
    a heat exchange system coupled to the hot side plate and configured to exhaust heat from the modular fluid delivery apparatus; and.

14. The modular fluid delivery apparatus of claim 13, wherein the thermoelectric device is a Peltier device.

15. The modular fluid delivery apparatus of claim 13, wherein the heat exchange system comprises a forced convection system including at least one fan.

16. The modular fluid delivery apparatus of claim 13, wherein the heat exchange system comprises a fin-type radiator.

17. A fluid delivery apparatus, comprising:
    a plurality of fluid flow meters;
    a first box enclosing the plurality of fluid flow meters;
    an intake disposed on the first box through which a cooling gas enters the first box and flows around an exterior surface of each of the plurality of fluid flow meters;
    an exhaust disposed on the first box through which the cooling gas exits the first box;
    a second box enclosing the first box and providing a circulation path through which the cooling gas from the exhaust returns to the intake;

a cold side plate conductively coupled to at least one side of the second box;

a thermoelectric device conductively coupled to the cold side plate;

a hot side plate conductively coupled to the thermoelectric device, the hot side plate disposed opposite the cold side plate and external of the second box, and the thermoelectric device positioned between the cold side plate and the hot side plate; and a heat exchange system conductively coupled to the hot side plate and configured to exhaust heat withdrawn from the plurality of fluid flow meters.

18. The fluid delivery apparatus of claim 17, further comprising:

a thermal insulating cover on the outside of the second box.

19. The fluid delivery apparatus of claim 17, wherein the thermoelectric device is a Peltier device, and the cooling gas is high purity nitrogen.

20. The fluid delivery apparatus of claim 17, wherein the heat exchange system includes a fin-type radiator thermally coupled to the hot side plate and a force convection system including at least one fan configured to force air over the fin-type radiator.

21. A gas panel coupled to a process chamber, the gas panel comprising:

at least one fluid delivery apparatus according to claim 17.

* * * * *